(12) United States Patent
Tzeng et al.

(10) Patent No.: US 6,791,368 B2
(45) Date of Patent: Sep. 14, 2004

(54) CURRENT SENSING CIRCUIT AND METHOD OF A HIGH-SPEED DRIVING STAGE

(75) Inventors: Guang-Nan Tzeng, Hsinchu (TW); Tien Tzu Chen, Taipei (TW)

(73) Assignee: Aimtron Technology Corp., Hsinchu (TW)

( * ) Notice: Subject to any disclaimer, the term of this patent is extended or adjusted under 35 U.S.C. 154(b) by 0 days.

(21) Appl. No.: 10/639,046

(22) Filed: Aug. 12, 2003

(65) Prior Publication Data

US 2004/0130359 A1 Jul. 8, 2004

(30) Foreign Application Priority Data

Jan. 8, 2003 (TW) ........................................ 92100373 A

(51) Int. Cl.[7] .............................................. G01R 19/00
(52) U.S. Cl. ........................................ 327/51; 327/53
(58) Field of Search ........................ 327/51–54, 66–67, 327/70, 78–81, 89, 103, 535, 537–546

(56) References Cited

U.S. PATENT DOCUMENTS

| | | | | | |
|---|---|---|---|---|---|
| 5,923,217 A | * | 7/1999 | Durec | .......................... | 330/288 |
| 6,147,550 A | * | 11/2000 | Holloway | ..................... | 327/544 |
| 6,271,695 B1 | * | 8/2001 | Gramegna et al. | ........... | 327/110 |
| 6,384,636 B1 | | 5/2002 | Koo | ............................. | 327/51 |
| 6,522,111 B2 | * | 2/2003 | Zadeh et al. | .................. | 323/277 |
| 6,700,360 B2 | * | 3/2004 | Biagi et al. | ................... | 323/280 |

* cited by examiner

*Primary Examiner*—My-Trang Nu Ton
(74) *Attorney, Agent, or Firm*—Seyfarth Shaw LLP

(57) ABSTRACT

The present invention discloses a current sensing circuit and method of a high-speed driving stage, which comprises an input stage, a level converting unit, a feedback unit, a current mirror unit and a current shunting unit. The current sensing circuit is capable of linearly detecting the output current of the driving stage transistors, and directly condensing the detected current to an appropriate value using the geometric ratio of the transistors, so as to facilitate the subsequent signal processing circuit to use it for control purposes.

13 Claims, 5 Drawing Sheets

CURRENT SENSING CIRCUIT AND METHOD OF A HIGH-SPEED DRIVING STAGE

BACKGROUND OF THE INVENTION (A) Field of the Invention

The present invention relates to a current sensing circuit and method of a high-speed driving stage, particularly to a current sensing circuit and method of a high-speed driving stage that can largely reduce power consumption.

(B) Description of Related Art

To prevent over-loading in electric circuits with high voltage or current, a current sensing circuit of a driving stage usually needs to be included for detecting abnormal changes in current.

A conventional current sensing circuit of a high-speed driving stage requires connecting a current detecting resistance in the driving stage in series, and then using an operational amplifier to enlarge the voltage of the current detecting resistance and convert it into a current for the subsequent signal processing. For this reason, the prior art current sensing circuit has the following drawbacks:

1. The use of series resistance will increase power consumption and lower efficiency.
2. The use of an operational amplifier will complicate the circuits and slow down the operating speed.
3. The series resistance inside the integrated circuits will fluctuate due to process variation and create errors of detecting current.

Another current sensing circuit is disclosed in U.S. Pat. No. 6,384,636 (referred to "636 patent" hereinafter), entitled "Fast and Precise Current-sense Circuit for High-voltage Switch." The current sensing circuit of the '636 patent comprises a first conductive path which is formed by the loading current switch and a second conductive path which is formed by the voltage divider, and an output circuit is used to measure the difference between the output current of the second conductive path and the bias current so as to determine the change of the loading current. However, the '636 patent requires a three-fold bias current due to the demand of its circuit design so that the power consumption of the '636 patent will increase. Additionally, the '636 patent requires the use of differential output mode so as to determine the change of the loading current, so its circuit design is more complicated and takes up more chip space.

In view of the existing problems of the prior art, the present invention hereby sets forth a novel current sensing circuit of a high-speed driving stage with a view to overcome the drawbacks mentioned above.

SUMMARY OF THE INVENTION

The main object of the present invention is to provide a current sensing circuit and method of a high-speed driving stage which are suitable for use in sensing circuits with low power consumption.

The current sensing circuit of a high-speed driving stage disclosed in the present invention is capable of linearly detecting the output current of the driving stage transistors, and directly condensing the detected current to an appropriate value using the geometric ratio of the transistors, so as to facilitate the subsequent signal processing circuit to use it for control purposes.

To achieve the above-mentioned objects, the current sensing circuit of a high-speed driving stage disclosed in the present invention comprises an input stage, a level converting unit, a feedback unit, a current mirror unit, and a current shunting unit. The input stage is used for controlling the synchronization of start-up and shut-off with the high-speed driving stage, and the level converting unit is used for converting the output voltage of the input stage. The feedback unit is used for converting the output voltage of the level converting unit into a current, and the current mirror unit is used for generating an output current that is proportioned to the feedback unit. The current shunting unit is used for shunting the output current of the current mirror unit, while generating a current that is proportional to the current of the high-speed driving stage.

The current sensing circuit of a high-speed driving stage of the present invention includes steps (a) to (d). In step (a), the output voltage of the high-speed driving stage is retrieved. In step (b), the output voltage level of the high-speed driving stage is adjusted by resistors and the first current source. In step (c), the voltage level is converted into a reference current by a feedback unit. In step (d), an output current is shunted from the reference current, wherein the output current is in direct proportion to the output current of the high-speed driving stage and the dimension ratio between the resistor and the transistor of the high-speed driving stage.

The present invention also allows the use of differential output mode, which, however, makes the circuit design more complicated and takes up more chip space. Furthermore, the transistors of the present invention can also be replaced with resistors that can function just as well with equivalent effects.

BRIEF DESCRIPTION OF THE DRAWINGS

The present invention will be described according to the appended drawings in which.

DETAILED DESCRIPTION OF PREFERRED EMBODIMENT

Figure 1:
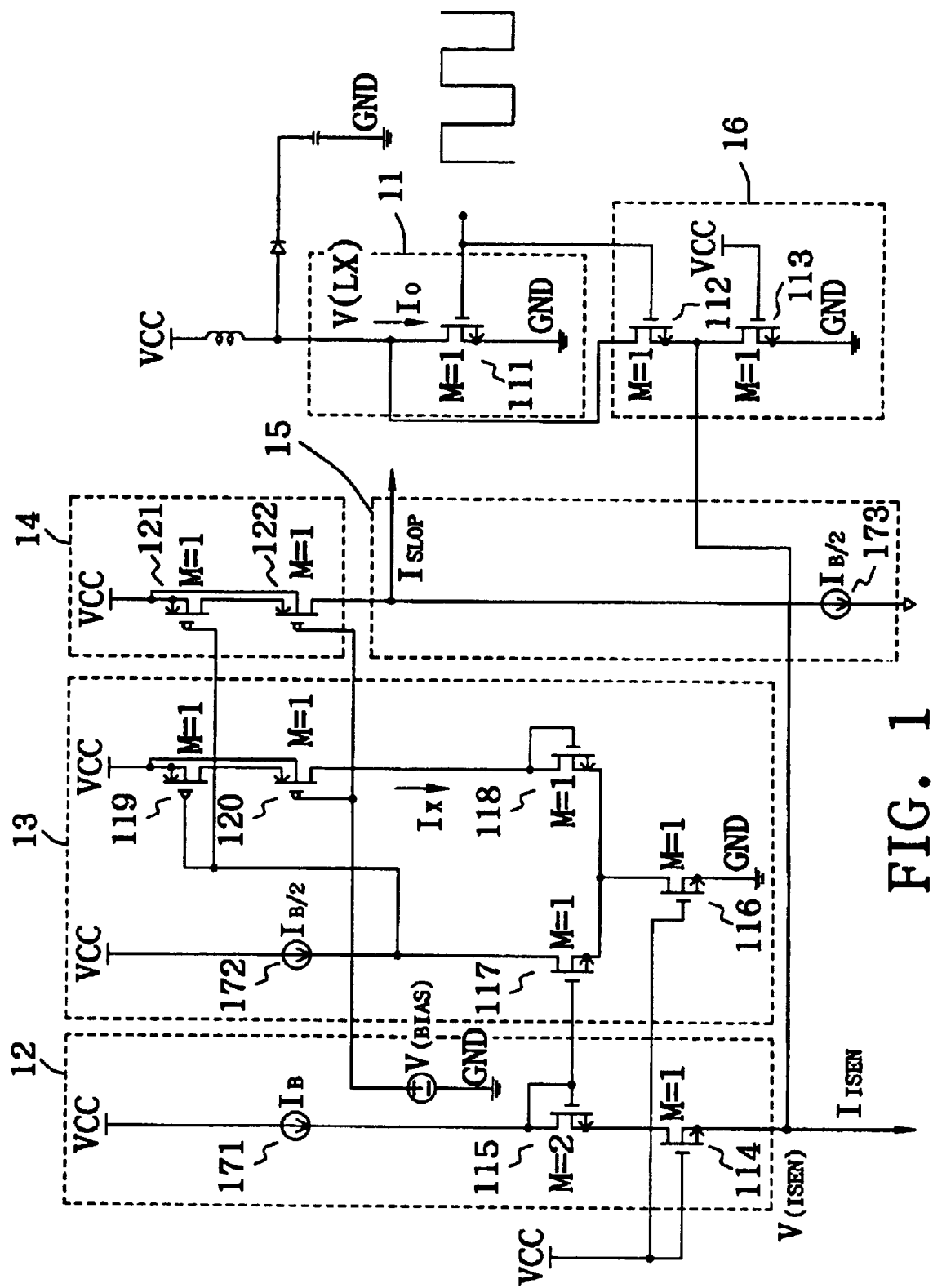
FIG. 1 illustrates a first preferred embodiment of the current sensing circuit of a high-speed driving stage according to the present invention.

FIG. 1 illustrates a first preferred embodiment of the current sensing circuit of a high-speed driving stage according to the present invention. The current sensing circuit comprises a level converting unit 12, a feedback unit 13, a current mirror unit 14, a current shunting unit 15 and an input stage 16. Generally speaking, in order to reduce power consumption of the output stage transistor 111 of high-speed driving stage 11, the drain to source voltage ($V_{DS}$) is usually controlled to be under 0.2 volt, that is, $V(LX) \leq 0.2$ volt. Nevertheless, for the current sensing circuit, it is necessary to further lower the output voltage V(LX) so as to reduce the power consumption. The input stage 16 of the present invention comprises transistors 112 and 113, which can take out the output voltage V(VX) of the high-speed driving stage 11 and divide the voltage for control purposes. The value of the divided voltage V(ISEN) is very small, usually smaller than 0.1 volt and suitable for reducing the power consumption of the circuit. Additionally, because the gate switches of the transistor 112 and the output stage transistor 111 of the high-speed driving stage 11 are controlled by the same signal, they will synchronize in starting up and shutting down for reducing power consumption prior to the start-up of the high-speed driving stage 11.

The level converting unit 12 comprises a first current source ($I_B$) 171, a first transistor 114 and a transistor 115. The $V_{DS}$ of the first transistor 114 is far smaller than its $V_{GS}$, so the first transistor 114 operates in a triode region and serves as a resistor for raising its drain voltage. The transistor 115 can serve as a buffer.

The feedback unit 13 comprises a second current source 172 and transistors 116 to 120. The current of the second current source 172 can be set at one half of the first current source 171, i.e.

$$\frac{I_B}{2},$$

and the geometric dimension of the transistors 116 to 120 can be set at one half of the transistor 115. Like the transistor 114, the $V_{DS}$ of the transistor 116 is far smaller than its $V_{GS}$, so the transistor 116 operates in a triode region and serves as a resistor for raising its drain voltage. In other words, the resistance value of the transistors 114 and 116 is $$R_{DS} = \frac{1}{\left[\mu C_{ox} \times \frac{W}{L} \times (V_{GS} - V_T)\right]},$$

wherein $V_T$ is the threshold voltage of transistors, $$\frac{W}{L}$$

is the geometric dimension of the transistors, $\mu$ is the mobility of the channeling carrier, and $C_{OX}$ is the capacitance value of the gate oxide layer of the transistors. The present invention can select the transistors 112, 113, 114 and 116 to be the same type; as $V_{GS}=V_{CC}$ and $V_{GS}>V_{DS}$, so the $R_{DS}(On)$ is in direct proportion to $$\frac{1}{\left(\frac{W}{L}\right)}, \text{ and } V(ISEN) = V(LX) \times \frac{1}{K},$$

wherein K represents the voltage division ratio between transistors 112 and 113.

The function of transistors 114 and 116 is to collocate with the first current source 171, the second current source 172 and the feedback circuit composed of the transistors 115, 117, 118, 119 and 120 for converting the voltage singal of V(ISEN) into current, and the corresponding electrical characteristic is shown as Equation 1, wherein M represents a transistor symbol, the number succeeding M represents the number assigned to the the transistor, and $I_X$ represents the current flowing through the transistor 118.

$$V(ISEN) + I_B \times R_{M114} + V_{GS}(M115) = \qquad \text{(Equation 1)}$$
$$V_{GS}(M117) + \left(\frac{I_B}{2} + I_X\right) \times R_{M116}$$

When rendered as $R_{M114}=R_{M116}=R_e$, $V_{GS}(M115)=V_{GS}(M117)$, the following result is reached:

$$V(ISEN) + I_B \times R_e = \left(\frac{I_B}{2} + I_X\right) \times R_e \qquad \text{(Equation 2)}$$

With further calculation, this leads to the following:

$$\frac{V(ISEN)}{R_e} + \frac{I_B}{2} = I_X \qquad \text{(Equation 3)}$$

Additionally, transistor 118 can serve as a unit gain amplifier, which prevents the operating voltage of the feedback unit 13 from fluctuating with the voltage $V_{CC}$ of the power source, so as to generate a stable current. The transistor 117 can serve as a buffer for keeping its source voltage under 0.1 volt.

The current mirror unit 14 comprises transistors 121 and 122 for generating a current with a ratio to $I_X$.

The current shunting unit 15 comprises a third current source 173 and a shunting node SLOP, wherein the third current source 173 contains a current of $$\frac{I_B}{2},$$

and the shunting node SLOP contains shunted current $I_{slop}$ As $$I_{slop} = I_X - \frac{I_B}{2},$$

Equation 3 can be further calculated as follows:

$$I_{slop} = \frac{V(ISEN)}{R_e} \qquad \text{(Equation 4)}$$

As $V(LX)=I_0 \times R_{M111}$ and $$V(ISEN) = \frac{1}{K} \times V(LX),$$

by setting into pattern of Equation 4, the results will be as follows, wherein $I_0$ represents the loading current of the driving stage 11.

$$I_{slop} = \frac{V(ISEN)}{R_e} = \frac{1}{K} \times \frac{V(LX)}{R_e} = \frac{1}{K} \times I_o \times \frac{R_{M111}}{R_e} \qquad \text{(Equation 5)}$$

As $R_{M111}$ and $R_e$ are in direct proportion to $$\frac{1}{\left(\frac{W}{L}\right)},$$

the result will be as follows:

$$I_{slop} = \frac{1}{K} \times I_0 \times \frac{\left(\frac{W}{L}\right)(M114)}{\left(\frac{W}{L}\right)(M111)}$$ (Equation 6)

Therefore, it is proved that $I_{slop}$ is proportional to $I_0$ with a fraction ratio.

The second current source 172 and third current source 173 of the present invention do not need to be exactly one half the current of first current source 171, as long as the total summation of second current source 172 and third current source 173 is equal to the current of first current source 171.

Figure 2:
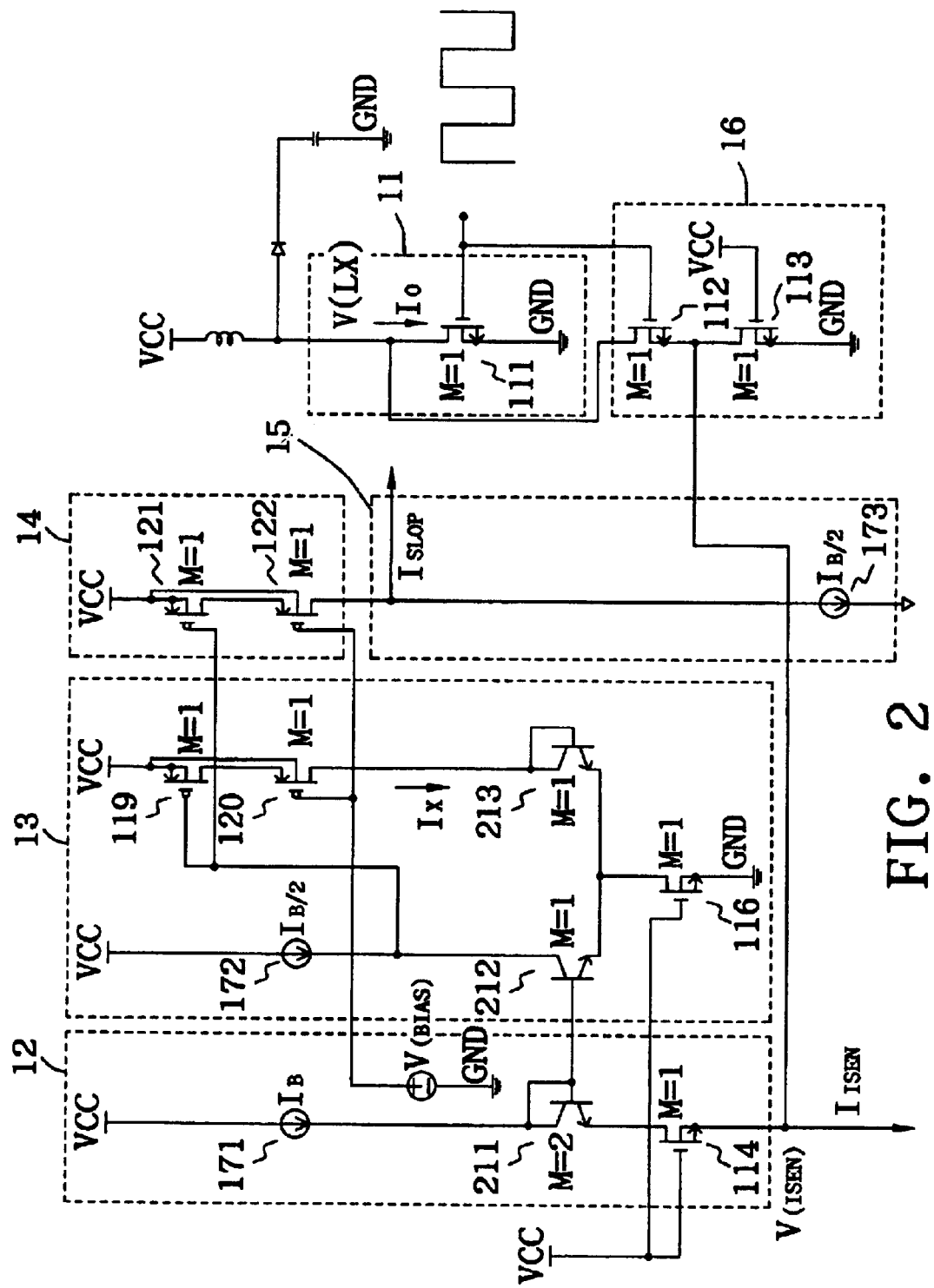
FIG. 2 illustrates a second preferred embodiment of the current sensing circuit of a high-speed driving stage according to the present invention.

FIG. 2 illustrates a second preferred embodiment of the current sensing circuit of a high-speed driving stage according to the present invention. In FIG. 2, the MOS transistors 115, 117, and 118 in the first preferred embodiment are replaced with bipolar transistors 211, 212 and 213 for enhancing its driving capacity. For the present invention also allows replacing the transistors 112 to 122 with other types, any variation in line with the technical concept of the present invention should, therefore, be regarded within the scope of the claim of the present invention.

Figure 3:
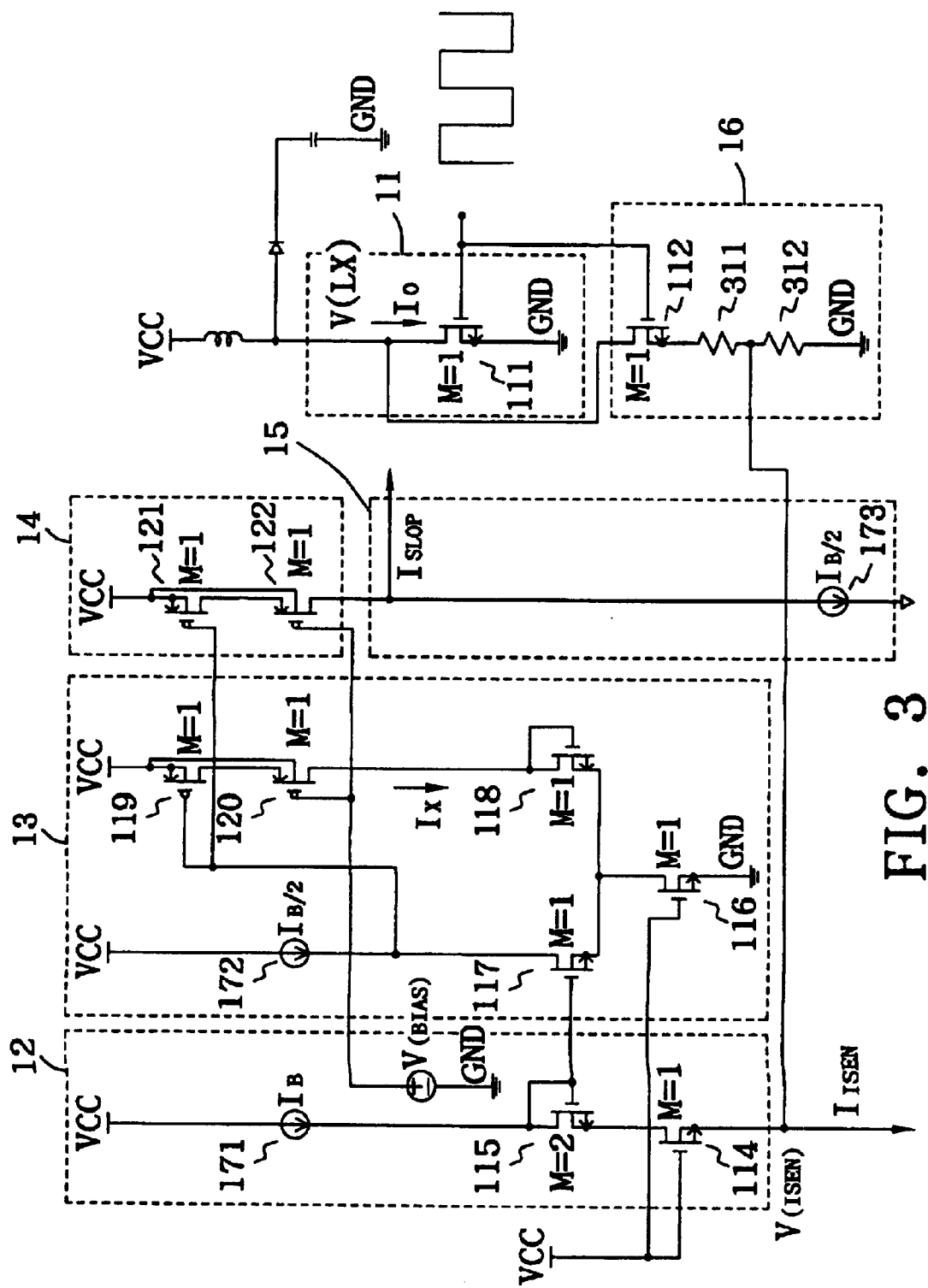
FIG. 3 illustrates a third preferred embodiment of the current sensing circuit of-a high-speed driving stage according to the present invention.

FIG. 3 illustrates a third preferred embodiment of the current sensing circuit of a high-speed driving stage according to the present invention. In FIG. 3, the transistors 112 and 113 are replaced with resistors 311 and 312. At this time, the shunted current $I_{slop}$ is described as follows:

$$I_{slop} = \frac{R312}{R311 + R312} \times I_0 \times \frac{\left(\frac{W}{L}\right)(M114)}{\left(\frac{W}{L}\right)(M111)}$$ (Equation 6)

Figure 4:
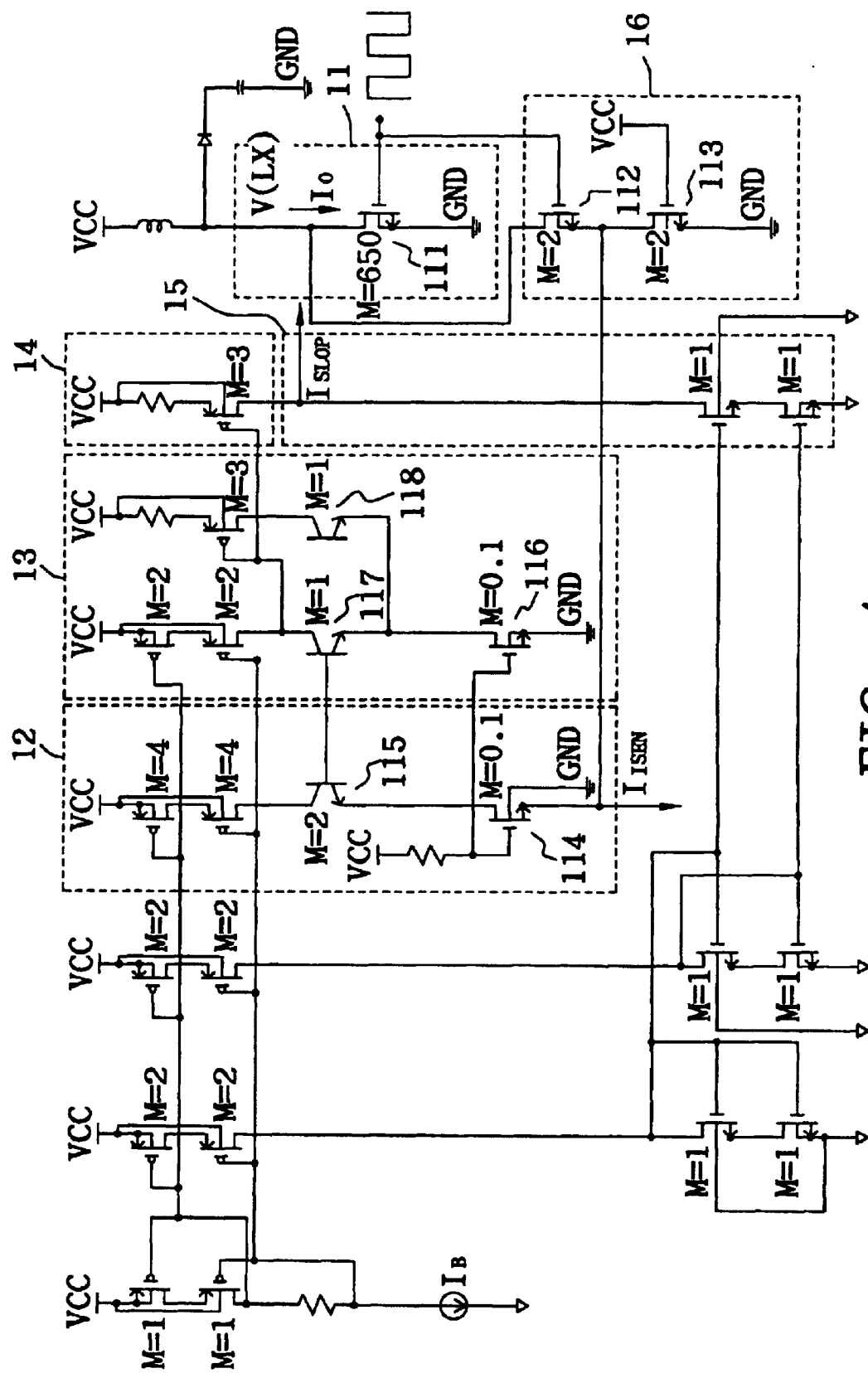
FIG. 4 illustrates a fourth preferred embodiment of the current sensing circuit of a high-speed driving stage according to the present invention.

FIG. 4 illustrates a fourth preferred embodiment of the current sensing circuit of a high-speed driving stage according to the present invention, indicating the circuit structure of the first current source 171 through the third current source 173.

Figure 5:
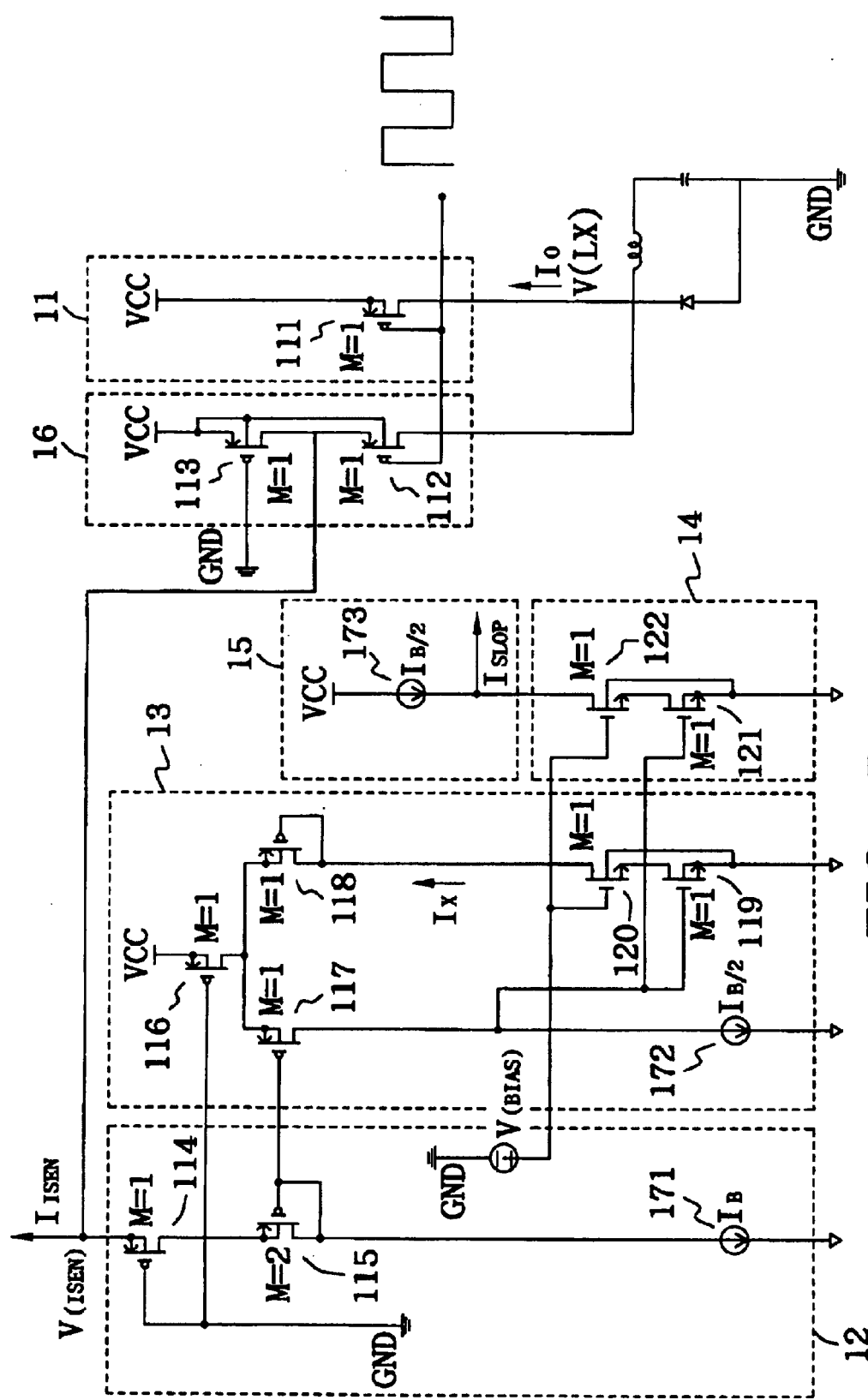
FIG. 5 illustrates a fifth preferred embodiment of the current sensing circuit of a high-speed driving stage according to the present invention.

FIG. 5 illustrates a fifth preferred embodiment of the current sensing circuit of a high-speed driving stage according to the present invention. In FIG. 5, the polarity of the transistors in the first preferred embodiment is interchanged; that is, NMOS transistors are changed into PMOS transistors, while PMOS transistors are changed into NMOS transistors.

In summary, the advantages of the current sensing circuit of a high-speed driving stage of the present invention include the following:

1. The current $I_{slop}$ as detected can be adjusted by the geometric ratio of the output stage transistor 111 to the first transistor 114, and can maintain an one-order linearity with the loading current $I_0$ of the driving stage.
2. The current $I_{slop}$ as detected is only related to the geometric ratio of the transistors, thus it is adaptable to the changes of operating parameters in the chip process.
3. The feedback unit 13 uses only one-stage feedback circuit, so it is simpler than the conventional operational amplifier. Additionally, it runs faster.
4. Since the output voltage V(LX) of the output stage transistor 111 of the driving stage 11 is directly detected without the use of series resistance, no extra power is consumed.

The above-described embodiments of the present invention are intended to be illustrative only. Numerous alternative embodiments may be devised by those familiar with the technology without departing from the scope of the following claims.

What is claimed is:

1. A current sensing circuit of a high-speed driving stage, comprising:
    an input stage synchronized with the high-speed driving stage;
    a level converting unit for converting an output voltage of the input stage;
    a feedback unit for converting an output voltage of the level converting unit into a current;
    a current mirror unit for generating an output current proportional to the current of the feedback unit; and
    a current shunting unit for shunting the output current of the current mirror unit so that an output current proportional to current of the high-speed driving stage is generated.

2. The current sensing circuit of a high-speed driving stage of claim 1, wherein the level converting unit comprises a first current source, a first transistor and a resistor.

3. The current sensing circuit of a high-speed driving stage of claim 2, wherein the resistor is a transistor operating in a triode region.

4. The current sensing circuit of a high-speed driving stage of claim 2, wherein a ratio between a geometric dimension of transistors of the feedback unit and a geometric dimension of the first transistor is equal to a ratio between current of a current source of the feedback unit and current of the first current source.

5. The current sensing circuit of a high-speed driving stage of claim 2, wherein a geometric dimension of transistors of the feedback unit is one half of that of the first transistor and current of a current source of the feedback unit is one half of that of the first current source.

6. The current sensing circuit of a high-speed driving stage of claim 2, wherein the output current of the current shunting unit is equal to the output current of the current mirror unit minus current of a third current source, wherein the current of the third current source is proportional to current of the first current source.

7. The current sensing circuit of a high-speed driving stage of claim 6, wherein the current of the third current source plus the current of the current source of the feedback unit is equal to the current of the first current source.

8. The current sensing circuit of a high-speed driving stage of claim 1, wherein the input stage comprises a voltage-dividing point.

9. A current sensing method of a high-speed driving stage, comprising the steps of:
    retrieving an output voltage of the high-speed driving stage;
    obtaining a voltage level by adjusting the output voltage of the high-speed driving stage by means of a resistor and a first current source;
    converting the voltage level into a reference current by means of a feedback unit; and
    shunting an output current from the reference current, wherein the output current is proportional to an output current of the high-speed driving stage and a dimension ratio between the resistor and a transistor of the high-speed driving stage.

10. The current sensing method of a high-speed driving stage of claim 9, further comprising a step of dividing the output voltage of the high-speed driving stage.

11. The current sensing method of a high-speed driving stage of claim 10, wherein the output current is proportional to a ratio of the voltage division.

12. The current sensing method of a high-speed driving stage of claim 9, wherein the feedback unit comprises a second current source, the reference current is connected to a third current source, and current of the second current source plus current of the third current source is equal to current of the first current source.

13. The current sensing method of a high-speed driving stage of claim 9, wherein the resistor is a transistor operating in a triode region.

* * * * *